(12) United States Patent
Liu et al.

(10) Patent No.: US 6,605,480 B2
(45) Date of Patent: Aug. 12, 2003

(54) WAFER LEVEL PACKAGING FOR MAKING FLIP-CHIPS

(75) Inventors: An-Hong Liu, Tainan (TW); Yuan-Ping Tseng, Hsinchu (TW); Y. J. Lee, Tainan (TW)

(73) Assignee: ChipMOS Technologies Inc., Hsinchu (TW)

( * ) Notice: Subject to any disclaimer, the term of this patent is extended or adjusted under 35 U.S.C. 154(b) by 0 days.

(21) Appl. No.: 09/994,700

(22) Filed: Nov. 28, 2001

(65) Prior Publication Data

US 2003/0098494 A1 May 29, 2003

(51) Int. Cl.[7] .............................................. H01L 21/66
(52) U.S. Cl. ................... 438/14; 438/12; 438/4
(58) Field of Search .................. 438/14, 4, 12, 438/17

(56) References Cited

U.S. PATENT DOCUMENTS 5,506,499 A * 4/1996 Puar ........................ 324/158.1
5,729,041 A    3/1998 Yoo et al. ................... 257/529
6,054,340 A * 4/2000 Mitchell et al. ............ 438/132
6,121,073 A    9/2000 Huang et al. ............... 438/132

FOREIGN PATENT DOCUMENTS

JP     405211219    * 8/1993
JP      10107063    * 4/1998

OTHER PUBLICATIONS

IBM Tech. Discl. Bull. vol. 34, No. 8, (Jan. 1992), pp. 401–404. (Abstract pp. 1–3).*

* cited by examiner

Primary Examiner—Caridad Everhart
(74) Attorney, Agent, or Firm—Troxell Law Office PLLC

(57) ABSTRACT

A wafer level packaging process for making flip-chips and integrated circuits formed are proposed. The process comprises in turn, providing a wafer, forming a protective material, bumping the wafer, removing the protective material, probing the wafer, laser repairing, and dicing the wafer. The laser repairing step is after bumping step. The protective material such as photoresist or metal layer is filled into the depression portions above the fuses for temporary protection of the fuses during bumping.

8 Claims, 6 Drawing Sheets

WAFER LEVEL PACKAGING FOR MAKING FLIP-CHIPS

FIELD OF THE INVENTION

The present invention is relating to integrated circuit (IC) manufacture technology, more particularly to a wafer level packaging process for making flip-chips with temporarily protected fuses and integrated circuits formed by the process.

BACKGROUND OF THE INVENTION

It is common that complicated integrated circuits have fuse structures, especially for high-capacity memory chips and single chips with system function. The fuse structures are connecting integrated circuits and redundant circuits. If defective circuits of integrated circuit are found after testing, then the corresponding fuse structures are struck by laser beam to replace defective circuits with redundant circuits, that is so-called "laser repair".

A testing process of semiconductor devices is described from U.S. Pat. No. 5,326,709 entitled "Wafer testing process of a semiconductor device comprising a redundancy circuit". The semiconductor device has a redundant circuit. At first PSG and nitride films are partially etched on a wafer for opening bonding pads. Thereafter, "testing before laser repairing", "laser repairing", "testing the repaired chips", and "off-line inking" are executed in order. Therefore, it is general that "laser repair" is executed in bare chip configuration, then, dicing and packaging of respective chips are executed. The wafer level packaging process doesn't include "bumping" step for making flip-chips. Besides, the passivation layer above the fuse usually is thinner such as dimples or fuse windows (referring to U.S. Pat. No. 6,121, 073). It is beneficial for laser beam to strike but easy to cause pollution and oxygenation problems on fuses in the manufacturing process of bumping and wafer level burn-in.

An integrated circuit with fuse structure is described from U.S. Pat. No. 5,729,041 "Protective film for fuse window passivation for semiconductor integrated circuit applications". As shown in FIG. 10, an integrated circuit 10 has a silicon substrate 11 on which a field oxide 12 of insulating silicon dioxide (SiO2) is formed to support the fuse 13 of tungsten or polycide. A plurality of insulating layers such as silicon oxide layer 14, spin on glass 15, and silicon oxide layer 16 are further formed on silicon substrate 11 and field oxide 12. The insulating layers 14,15,16 forms an opening 17 corresponding to fuse 13, so that there is no insulating layer above fuse 13. Also a permanent protective layer 18 is permanently formed on the exposing surface of silicon dioxide layer 16 and opening 17. The protective layer 18 is laser-pervious over 50%, and properly protects the fuse 13 without detrimental influence on laser repair for preventing pollution or metal oxygenation. However, the high laser-pervious protection layer 18 will be on the integrated circuit 10 permanently after finishing manufacturing process, so that thickness, material, and manufacturing conditions of protective layer 18 must be precisely controlled. The protective layer 18 made from silane and ammonia is formed by means of plasma enhance chemical vapor deposition (PECVD) technique. The protective layer 18 is made of silicon and nitrogen which should be in the ratio of between 1 to 1.2 and 1 to 1.6, and its thickness must be between 3,000 and 15,000 angstrom. Besides, it is not described that the fuse structure with transparent protective layer 18 is how to be used in wafer level packaging process for making flip-chips.

SUMMARY

The main object of the present invention is to provide a wafer level packaging process for making flip-chips in order to solve the problem mentioned above. A material easy to remove such as photoresist or protective metal layer is formed in the depression portion above the fuse prior to bumping for ensuring the fuse structure will not to be polluted and oxygenated in the process of plating and bumping. The protective material is removed prior to laser repairing for protecting the fuse temporarily.

The another object of the present invention is to provide an integrated circuit having a protective material easy to be removed in the depression portions of insulating layer above fuses for temporary protection of the fuses.

According to the wafer level packaging process for making flip-chips of the present invention, a wafer includes a plurality of chips integrally, wherein each chip has a plurality of bonding pads, a plurality of fuses, and at least an insulating layer. The insulating layer exposes the bonding pads and has depression portions corresponding to the fuses. A protective material such as photoresist or protective metal layer is formed in the depression portions. A plurality of conductive bumps are formed on the bonding pads by evaporation, printing, sputtering or/and plating. Then, the protective material is removed. The wafer is probed for analyzing if there are fail chips required to be repaired. Laser beam strikes the fuses without the protective material in the corresponding depression portions for repairing chips, then the wafer is diced to singulate the flip chip.

DETAILED DESCRIPTION OF THE PRESENT INVENTION

Figure 1:
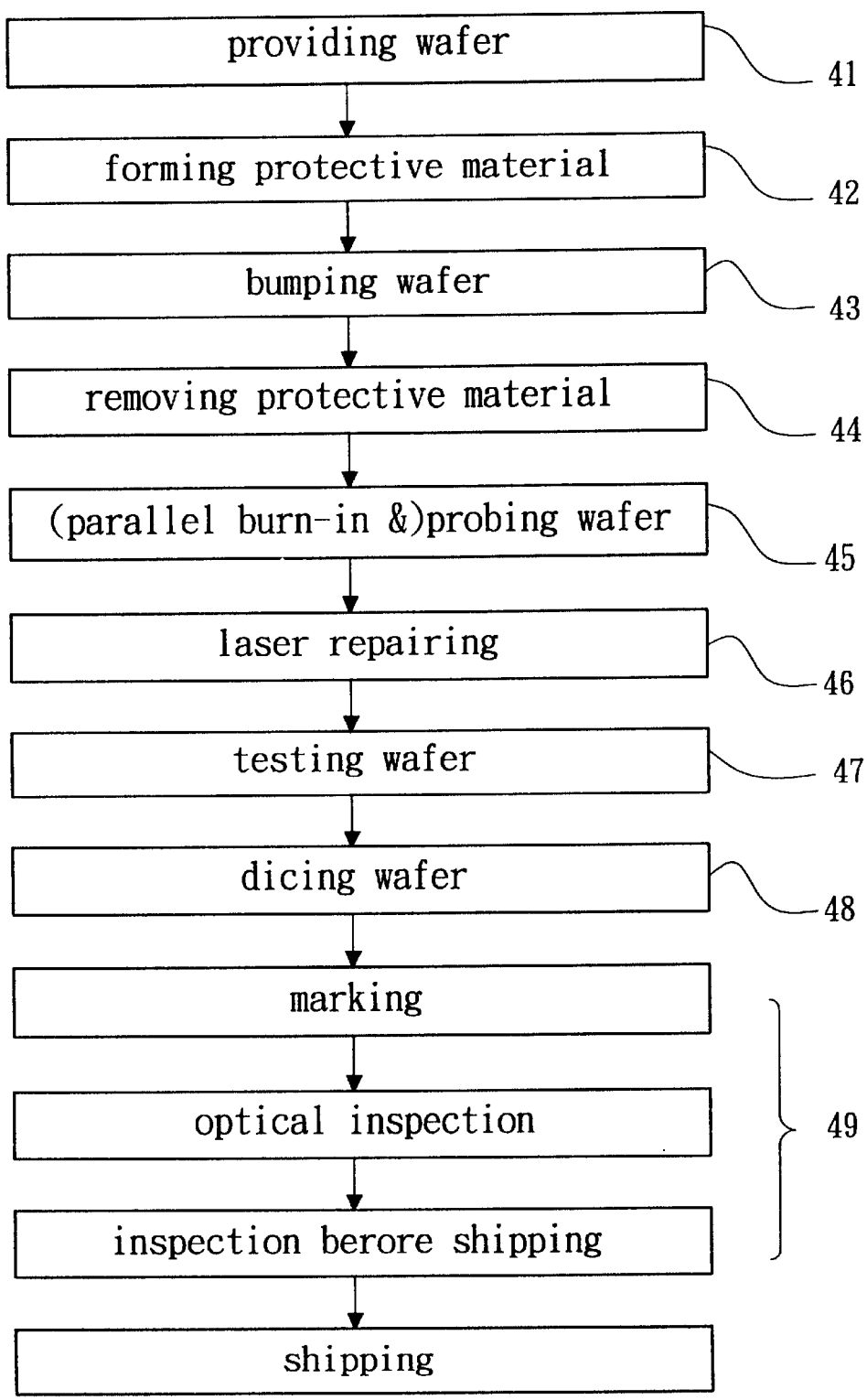
FIG. 1 is a process flowchart of a wafer level packaging process for making flip-chips in accordance with the present invention.

Referring to the drawings attached, the present invention will be described by means of the embodiments below.

According to the first embodiment of the present invention, the wafer level packaging process for making flip-chips is as shown in FIG. 1, comprises in turn "providing wafer" 41, "forming protective material" 42, "bumping wafer" 43, "removing protective material" 44, "(parallel burn-in &) probing wafer" 45, "laser repairing" 46, "testing the wafer" 47, "dicing the wafer" 48, and "marking, optical inspection, inspection before shipping" 49, they will be described as the following.

Figure 2:
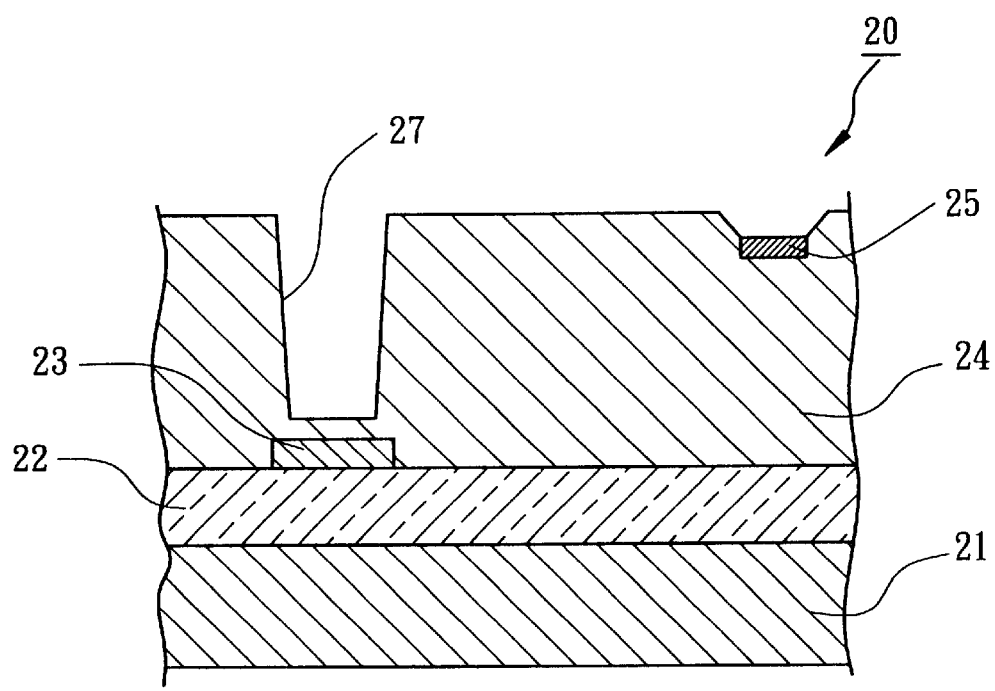
FIG. 2 is a partial cross-sectional view of a provided wafer with a fuse in accordance with the first embodiment of the present invention.

At first, in the step of "providing wafer" 41, a wafer is provided which integrally includes a plurality of chips 20 (the number of chips is about several hundreds to few thousands). As shown in FIG. 2, each chip 20 has a silicon substrate 21 that forms a first insulating layer 22 such as a field oxide. The first insulating layer 22 supports fuses 23 made of several kinds of conductive materials such as tungsten, polysilicon, aluminum or polycide. Each fuse 23 is connected with integrated circuits and a redundancy circuit (RC) for changing the electrical path of redundancy circuit. A second insulating layer 24 is formed above silicon substrate 21 and first insulating layer 22. The second insulating layer 24 commonly has multi layers with composite structures that at least include familiar passivation layers of bare chip and flip-chip and multi layers of integrated circuits inside the layer. The fuse 23 is deeply embedded inside the second insulating layer 24. The second insulating layer 24 has a depression portion 27 corresponding to the fuse 23, so that the thickness of the second insulating layer 24 above the fuse becomes thinner for striking of laser beam on the fuse 23. Each chip 20 comprises a plurality of bonding pads 25 exposed from the second insulating layer 24. Moreover, in this embodiment, the bonding pads 25 of chip 20 are flip-chip bonding pads, which arrange in grid array and connect with the corresponding bare chip bonding pads (not shown in drawing) at the center or perimeters of chip 20 originally by redistribution metal wires. However, the bonding pads 25 of chip 20 should not only be limited in grid array arrangement, they may also be arranged over the center or perimeters of an active surface of the chip 20.

Figure 3:
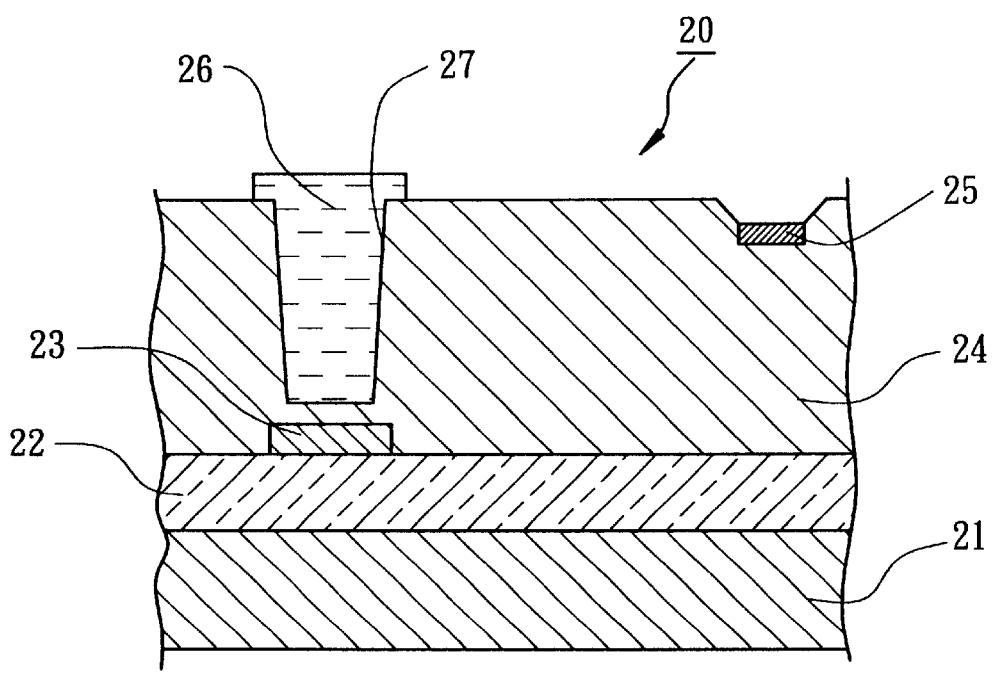
FIG. 3 is a partial cross-sectional view of the wafer forming a protective material in accordance with the first embodiment of the present invention.

Thereafter, in the step of "forming protective material" 42, as shown in FIG. 3, a material easy to be removed such as photoresist 26 or others is filled into the depression portions 27 by means of spin coating and photolithography technique as a temporary protection of fuse 23 in the manufacturing process. It is better that a cap (not shown in drawings) is further formed above the depression portion 27 by using semiconductor manufacturing process for preventing the photoresist 26 from dissolving or flowing out improperly. The forming method of photoresist 26 is to form a layer of photoresist 26 on the exposing surface of the second insulating layer 24 by spin coating. The photoresist agent 26 is made of one kind of positive photoresists, such as phenol resin, novolak or polymethyl methacrylate, or a negative photoresist of diazide for causing a photochemical reaction to change structure. The photoresist 26 is filled in the depression portion 27. When photoresist 26 is negative photoresist, the photoresist 26 above the depression portion 27 will be exposed for forming a non-dissolved structure in the depression portion 27. Then, photoresist 26 on outer surface of the second insulating layer 24 is washed away (dissolved) by xylene except for the photoresist 26 in depression portion 27. Otherwise, when photoresist 26 is positive photoresist, the photoresist 26 on the outer surface of the second insulating layer 24 will be exposed except for the photoresist 26 above depression portion 27, and dissolveded by alkali metal solution or organic alkali solution for directly forming the structure of photoresist 26 in the depression portion 27. Then, photoresist 26 is baked (hard bake) to become harder and to remove residue solution.

Figure 4:
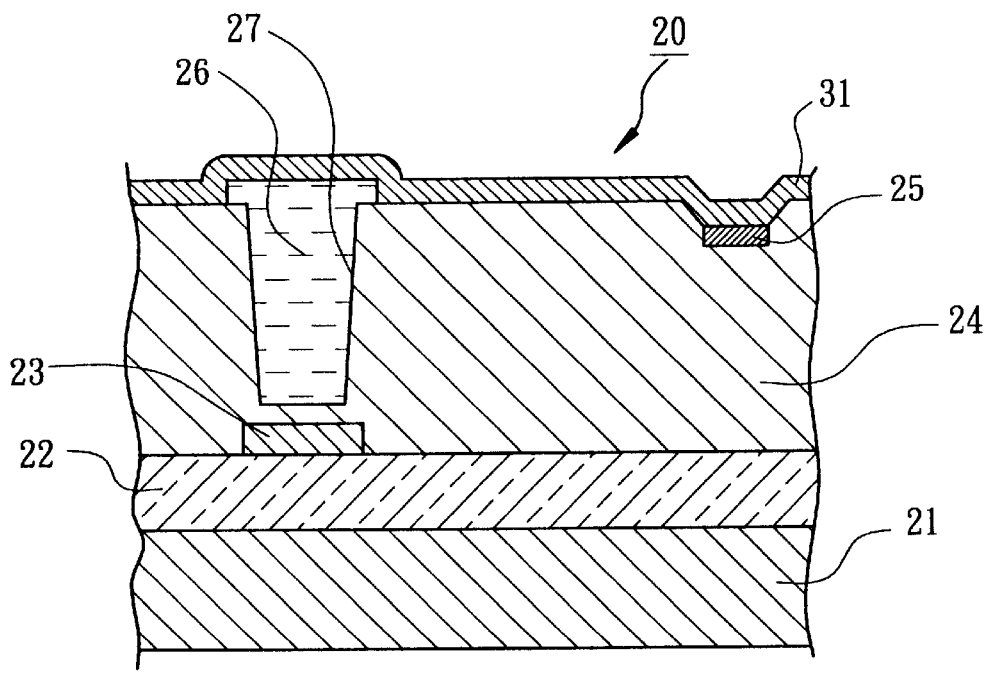
FIG. 4 is a partial cross-sectional view of the wafer with UBM layer in accordance with the first embodiment of the present invention.
Figure 5:
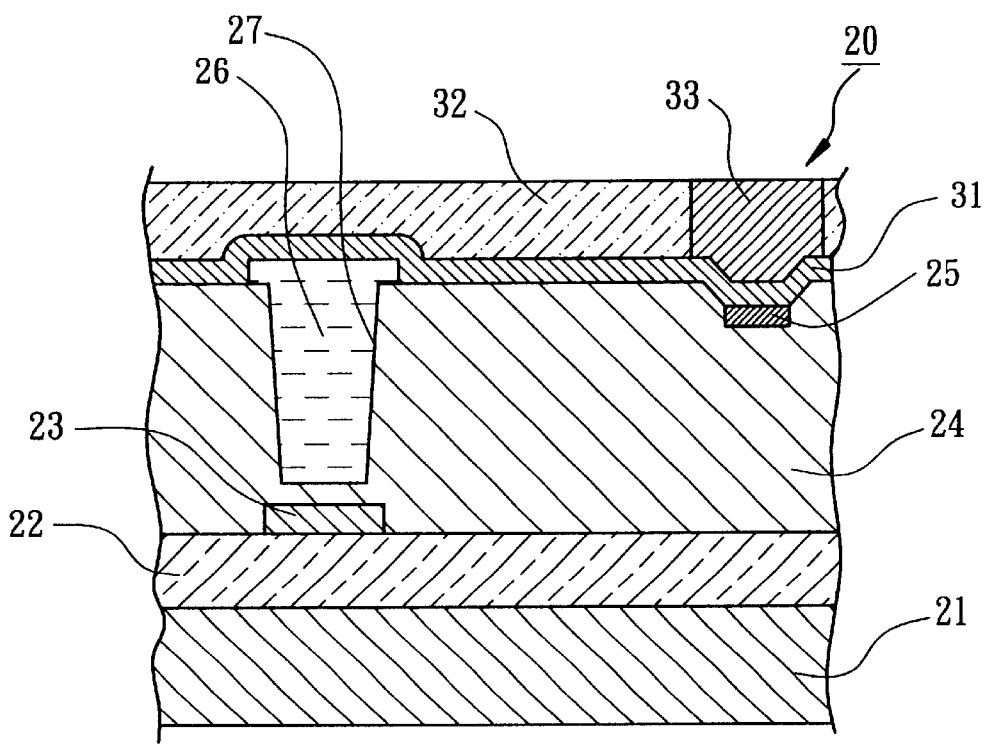
FIG. 5 is a partial cross-sectional view of the wafer with bumps in accordance with the first embodiment of the present invention.

Next, "forming an under bump metallization (UBM) layer" should be executed during the step of "bumping wafer" 43. FIG. 4 illustrates that an under bump metallization (UBM) layer 31 is formed by sputtering. The UBM layer 31 is a multi metal layers with composite structure, made of chromium copper, chromium chromium copper-alloy, chromium-nickel-titanium, titanium-copper-nickel, or chosen from other proper materials of chromium, copper, titanium, nickel, tungsten, gold, palladium, vanadium, etc. It is familiar that a thin gold layer is deposited on the upmost layer of UBM layer 31 in order to avoid oxygenation of copper. Next, as shown in FIG. 5, in the step of "bumping wafer" 43, a photoresist 32 is covered on the UBM layer 31. The photoresist 32 forms openings at the portion corresponding to the bonding pads 25, so that bonding pads 25 are exposed from the UBM layer 31. Then, metal bumps 33 for bonding such as lead-tin alloy or gold, etc are formed on openings of UBM layer 31 by printing, plating or evaporation. Next, photoresist 32 and other UBM layer 31 outside bump 33 are removed in turn. Commonly, bump 33 of lead-tin alloy may form a spherical bump by reflowing.

Figure 6:
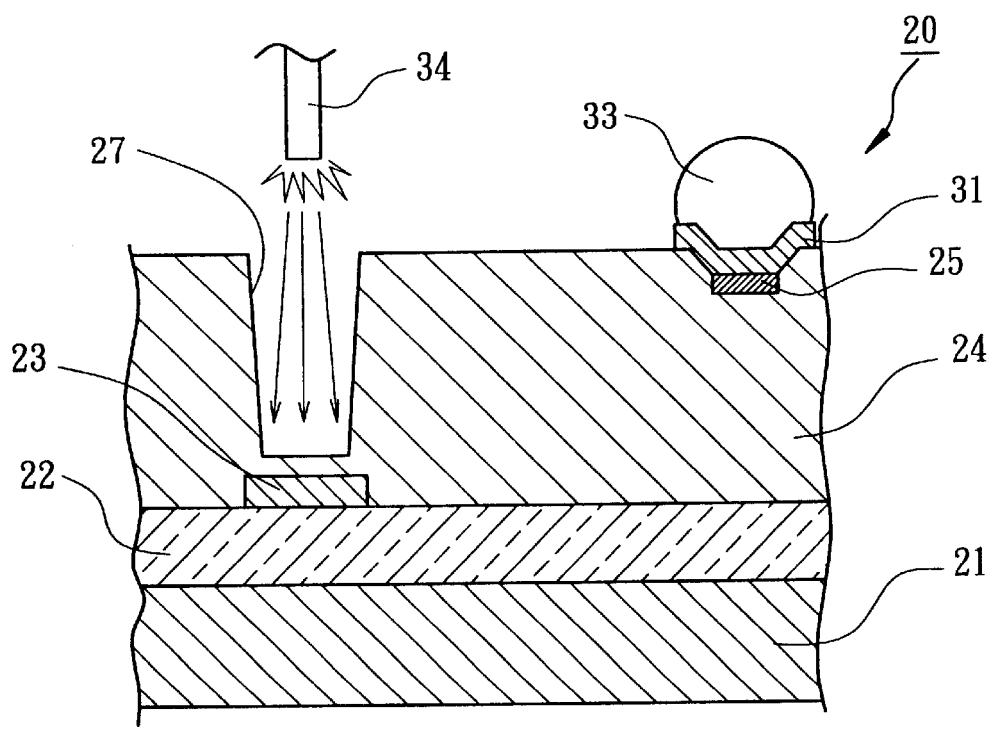
FIG. 6 is a partial cross-sectional view of the wafer under laser repairing in accordance with the first embodiment of the present invention.

Next, in the step of "removing protective material" 44, the structure after removing photoresist 26 by dry etching or wet etching method is as shown in the cross-sectional view of FIG. 6. Meantime, there is no photoresist 26 in the depression portion 27 for laser repairing easily. Thereafter, in the step of "(parallel burn-in &) probing wafer" 45, repairable chips are identified by electrical probing and analyzing. Alternatively, a burn-in process may also be adopted during or before the step of "probing the wafer" 45 that is to put at least a wafer in a parallel burn-in testing machine. Commonly, the burn-in environmental condition of wafers is to maintain 75° C. to 150° C. and keep burn-in time from 12 hrs to 128 hrs for eliminating potentially fail chips (or the chips with short usage life). Multiple chips on the wafer are probed by wafer level testing equipment, analyzed, and classified to be the good chips unnecessary for repairing, fail chips need to be repaired, and non-repairable fail chips.

If there is a fail chip needs to be repaired, the step of "laser repairing" 47 is performed. The fail chip need to be repaired is repaired by a laser equipment 34. The laser beam strikes the fuse 23 so as to replace fail integrated circuit with redundant circuit. Thereafter, "testing the wafer" 47 is executed to classify the chips of the wafer according to their functions or qualities. Then, a plurality of flip-chip type chips passing through (burn-in &) test are obtained after executing the step of "dicing wafer" 48 for singulation of the chips. Finally, "marking, optical inspection and inspection before shipping" 49 are executed before shipping.

In the step of "bumping wafer" 47 by sputtering and plating or other method, the photoresist 26 is filled in the depression portion 27 for temporary protection of the fuse 23. So that the fuse 23 won't be polluted and oxygenated in the succeeding steps of wafer level packaging process for making flip-chips according to the present invention. The photoresist 26 in the depression portion 27 may also be removed easily for laser repairing, and solving the problem of "fuse is not protected temporarily" mentioned above.

Figure 7:
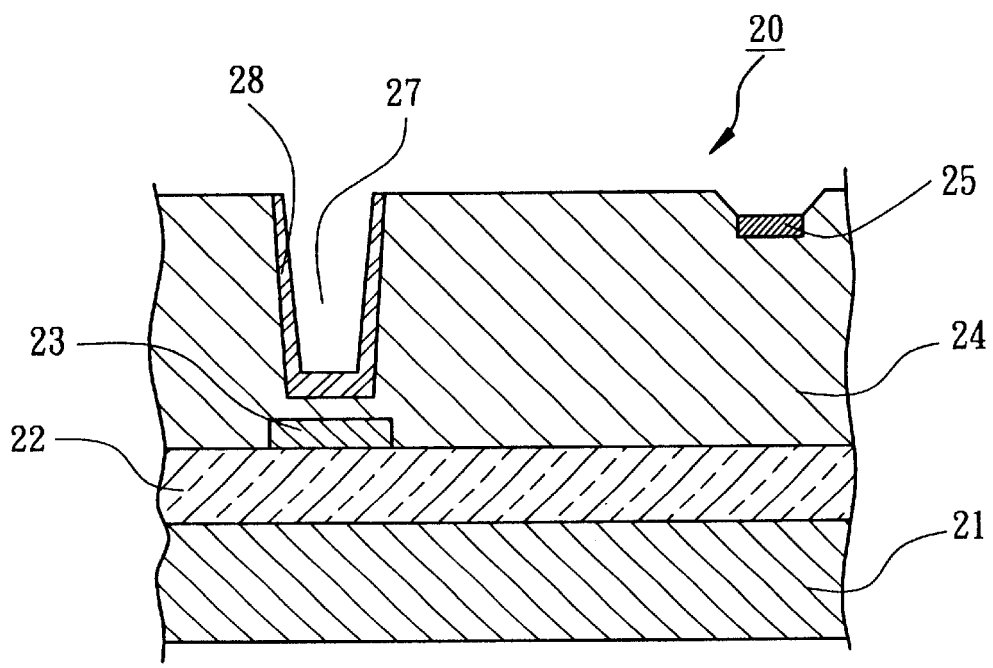
FIG. 7 is a partial cross-sectional view of a provided wafer forming a protective material in accordance with the second embodiment of the present invention.
Figure 8:
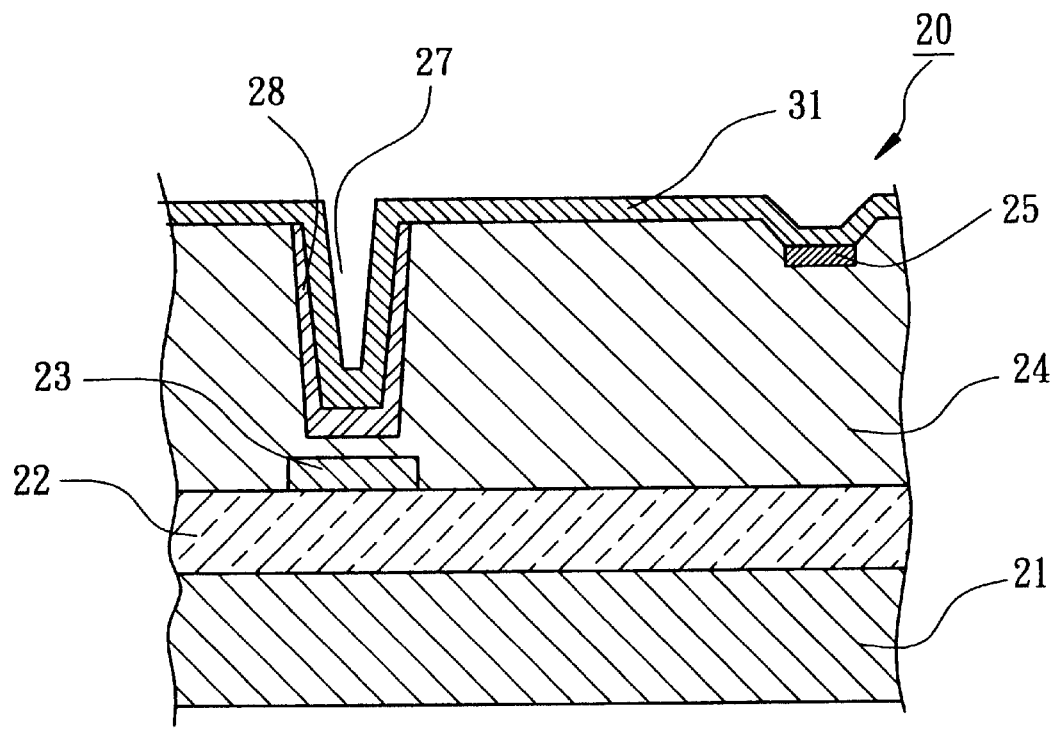
FIG. 8 is a partial cross-sectional view of the wafer with UBM layer in accordance with the second embodiment of the present invention.
Figure 9:
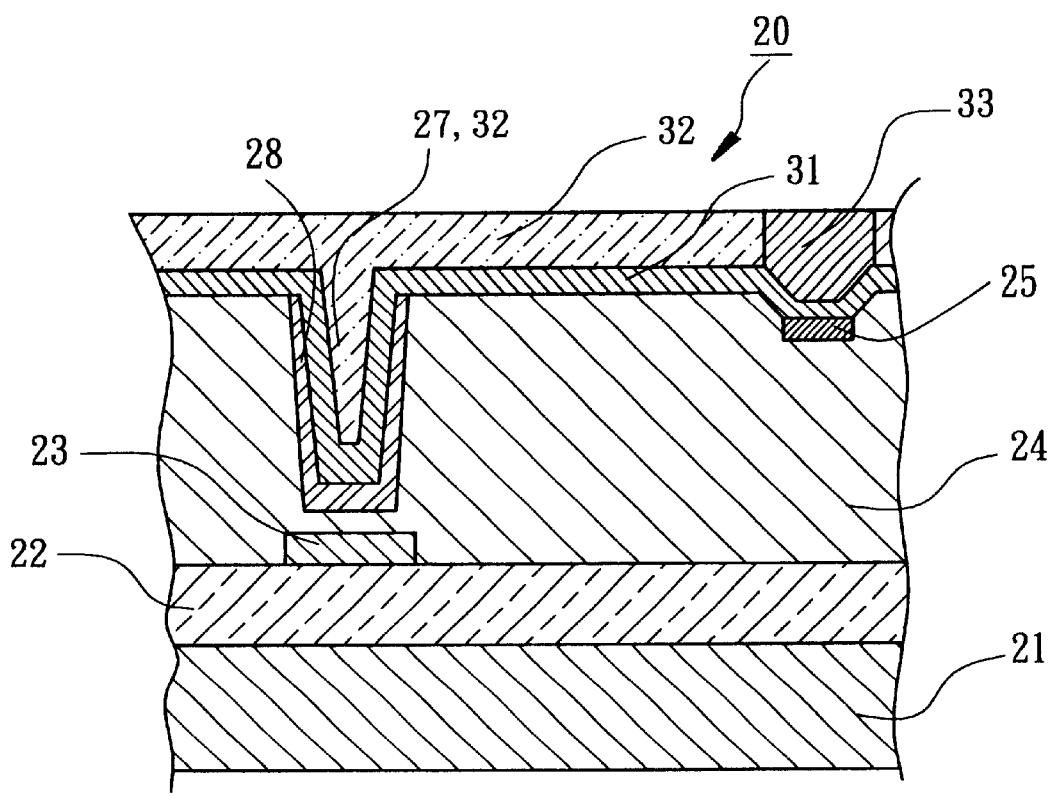
FIG. 9 is a partial cross-sectional view of the wafer with bumps in accordance with the second embodiment of the present invention.
Figure 10:
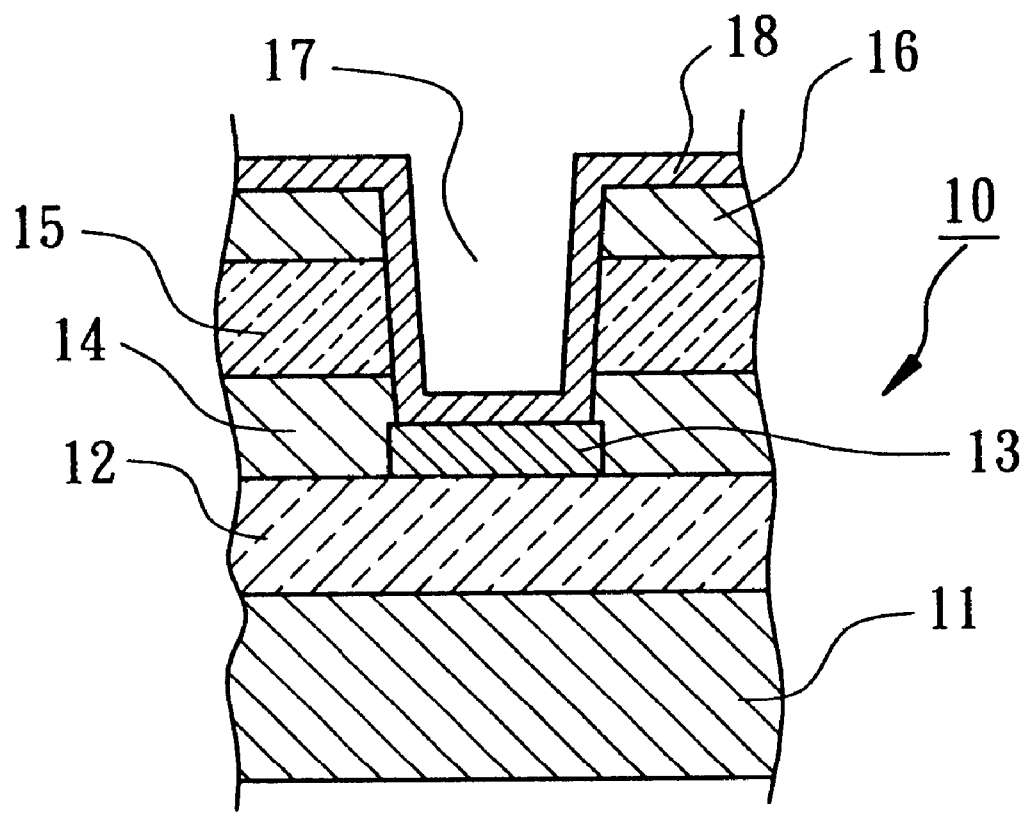
FIG. 10 is a cross-sectional view of an integrated circuit of U.S. Pat. No. 5,729,041 "Protective film for fuse window passivation for semiconductor integrated circuit applications".

In the second embodiment of the present invention, a protective metal layer 28 is formed to replace the photoresist 26 of the first embodiment in the step of "forming protective material" 42 after the step of "providing wafer" 41. As shown in FIG. 7, a protective metal layer 28 deposits in the depression portion 27 for temporarily protecting the fuse 23 in the manufacturing process. In general, the protective metal layer 28 is formed by means of the method of physical vapor deposition, chemical vapor deposition, plasma enhanced vapor deposition, or sputtering deposition, etc. At first, a metal layer is formed on the second insulating layer 24, then, the metal layer is removed except for the metal layer in the depression portion 27 to form a protective metal layer 28 in the depression portion 27. The protective metal layer 28 may choose the material of titanium, chromium or nickel. It is better that the material of protective metal layer 28 should match the material of UBM layer 31 for removing easily. Next. As shown in FIG. 8, a UBM layer 31 is formed by vapor deposition or sputtering method. As shown in FIG. 9, in the step of "bumping wafer" 43, a photoresist 32 is covered on the UBM layer 31. The photoresist 32 has an opening above the bonding pad 25, so that UBM layer 31 at the portion of bonding pad 25 is exposed. Thereafter, a conductive bump 33 is covered in the opening of the UBM layer 31 by plating method. Then, in the step of "removing protective material" 44, the protective metal layer 28 and UBM layer 31 are removed by dry etching or wet etching method. Thus, the chips in the wafer also have the cross-sectional view as shown in FIG. 6. Meantime, there is no protective metal layer 28 in the depression portion 27 for laser repairing.

The above description of embodiments of this invention is intended to be illustrated and not limiting. Other embodiments of this invention will be obvious to those skilled in the art in view of the above disclosure.

What is claimed is:

1. A wafer level packaging process for making flip-chips comprising the steps of:

providing a wafer including a plurality of chips integrally, wherein each chip has a plurality of bonding pads, a plurality of fuses, and at least an insulating layer, the insulating layer exposes the bonding pads and has depression portions corresponding to the fuses;

forming a protective material completely filling the depression portions prior to a bumping step;

bumping on the bonding pads after forming the protective material so as to form a plurality of electrical bumps on the bonding pads of the wafer having the protective material;

removing the protective material on the wafer with bumps;

probing the wafer for analyzing if there are fail chips required to be repaired;

laser repairing the repairable fail chips by means of laser beam striking the fuses without the protective material in the corresponding depression portions; and dicing the wafer for singulating the chips.

2. The wafer level packaging process for making flip-chips in accordance with claim 1, wherein the protective material is a photoresist.

3. The wafer level packaging process for making flip-chips in accordance with claim 1, wherein the protective material is a protective metal layer.

4. The wafer level packaging process for making flip-chips in accordance with claim 1, further comprising the step of forming an under bump metallization (UBM) layer prior to the bumping step.

5. The wafer level packaging process for making flip-chips in accordance with claim 4, wherein an under bump metallization (UBM) layer is formed by sputtering.

6. The wafer level packaging process for making flip-chips in accordance with claim 1, wherein the bumps on the wafer are formed by plating.

7. The wafer level packaging process for making flip-chips in accordance with claim 1, further comprising the step of burn-in testing the wafer prior to the step of "probing the wafer".

8. The wafer level packaging process for making flip-chips in accordance with claim 1, wherein the step of "probing the wafer" includes burn-in testing the wafer simultaneously.

* * * * *